United States Patent [19]
Akiba et al.

[11] Patent Number: 5,793,694
[45] Date of Patent: Aug. 11, 1998

[54] SEMICONDUCTOR INTEGRATED CIRCUIT DEVICE HAVING MEANS FOR PEAK CURRENT REDUCTION

[75] Inventors: Takesada Akiba, Tachikawa; Hiroshi Otori; Masayuki Nakamura, both of Ome, all of Japan; Adin Hyslop, Dallas, Tex.

[73] Assignee: Hitachi, Ltd., Tokyo, Japan

[21] Appl. No.: 767,724

[22] Filed: Dec. 17, 1996

Related U.S. Application Data

[60] Provisional application No. 60/008,264 Dec. 22, 1995.
[51] Int. Cl.[6] ........................................... G11C 8/00
[52] U.S. Cl. .................. 365/230.03; 365/194; 365/222
[58] Field of Search ........................... 365/222, 205, 365/207, 208, 193, 194, 230.03

[56] References Cited

U.S. PATENT DOCUMENTS

| | | | |
|---|---|---|---|
| 4,627,033 | 12/1986 | Hyslop | 365/205 |
| 4,912,678 | 3/1990 | Mashiko | 365/222 |
| 5,208,782 | 5/1993 | Sakuta et al. | 365/230.03 |
| 5,367,493 | 11/1994 | Yamagata | 365/222 |
| 5,371,715 | 12/1994 | Kim | 365/233 |
| 5,442,588 | 8/1995 | Runas | 365/222 |

*Primary Examiner*—Son Mai
*Attorney, Agent, or Firm*—Haynes and Boone, L.L.P.

[57] ABSTRACT

The present invention is a method and apparatus for reducing the peak current for all the bit mats during a CAS-before-RAs refresh operation of a DRAM. To this end, a circuit is created to detect a CAS-before-RAS refresh operation. When a CBR refresh is detected, the amplifying of the bit mats are offset from each other, thereby staggering the time when each bit mat draws its peak current. In an alternative embodiment, when a CBR refresh is detected, the activation of the word lines are offset from each other, thereby staggering the time when each bit mat draws its peak current.

8 Claims, 12 Drawing Sheets

SEMICONDUCTOR INTEGRATED CIRCUIT DEVICE HAVING MEANS FOR PEAK CURRENT REDUCTION

CROSS REFERENCE

This application claims the benefit of U.S. Provisional Application Ser. No. 60/008,264, filed Dec. 22, 1995.

BACKGROUND OF THE INVENTION

The invention relates generally to semiconductor circuit design and, more particularly, to a method and apparatus for reducing peak current consumption in an integrated circuit.

As semiconductor technology develops, the number of transistors included in a single integrated circuit, or "chip," is becoming larger and the design rule parameters therefor are becoming smaller. As a result, current consumption by the chip becomes more critical because so many transistors are in operation. Of particular importance is peak current consumption during different chip operation times. Reducing peak current consumption is an important design challenge in most semiconductor designs, including designs for dynamic random access memory ("DRAM") devices.

Referring to FIG. 1, a simplified block diagram illustrates the operation of a conventional DRAM 10. The DRAM 10 has an array of memory cells, peripheral logic, and inputs and/or outputs. The array of memory cells, or bits, is represented by two memory cell sub arrays 12a–12b, each containing a plurality of bits represented by bits B1–B9 and B10–B18, respectively. The inputs are represented by four address lines designated A0–A3, a column address strobe clock ("CABS") line and a row address strobe ("RNAS") line. Most conventional DRAMs have many more inputs, outputs and subarrays, and the above description is simplified for illustrative purposes only.

To select a memory cell, or bit, from the DRAM, the CAS and RAS signals determine whether the A0–A3 are to be stored into a Column Address Buffer ("CAB") 14 or Row Address Buffer ("RAB") 16, respectively. The RAB 16 drives a Row Decoder ("RD") 18a, which in turn selects one of two word line drivers 20a or 20b which enables one of a group of word lines WL1–WL3 or WL4–WL6, respectively. Each of the word lines, when enabled, activates a row of bits. For example, WL1 activates the row of bits B1, B2 and B3.

Each row of bits, in turn, drives signals on a bit mat MAT1 or MAT2. MAT1 represents a group of bit lines BL1–BL3 that are concurrently activated when either WL1, WL2 or WL3 is enabled, and MAT2 represents a group of bit lines BL4–BL6 that are concurrently activated when either WL4, WL5 or WL6 is enabled. The bit lines BL1–BL3 and BL4–BL6 connect each bit on a row of bits to a corresponding sense amplifier 22a and 22b, respectively, where the bit signal is amplified to a stronger, more stable signal.

While this is occurring, the CAB 14 drives a column decoder ("CD") 18b, which in turn enables individual circuits in the sense amplifier 22a or 22b to select one bit line from the bit lines BL1–BL3 or BL4–BL6, respectively. In this manner, one bit signal is selected from an entire row of bits.

In FIG. 2, two normal operations 23a and 23b and three CAS before RAS ("CBR") refresh operations 24a–24c are illustrated, wherein normal operations include read, write or RAS-only refresh operations. Referring also to FIG. 1, in the first normal operation 23a, the word line WL1 is selected from the first word line driver 20a, thereby selecting the bit mat MAT1. Likewise, the sense amplifier 22a is also selected. However, in order to reduce operating current, no other word lines, bit mats, or sense amplifiers are selected. As a result of the single bit mat and single sense amplifier selection, the total peak current for all the bit mats MAT1 and MAT2, represented by a waveform labeled I(BL), reaches a first level 26a. Similarly for the second read operation 23b, the word line WL4 is selected, thereby selecting the bit mat MAT2 and the sense amplifier 22b (FIG. 1).

However, during the CBR refresh operations 24a–24c, two word lines, for example, word lines WL1 and WL4, are concurrently selected, one from each subarray 12a, 12b, to speed up the CBR refresh operation. As a result, two bit mats MAT1 and MAT2 are simultaneously selected. Because twice as many bit mats are selected, I(BL) reaches a second level 26b, which is twice that of the first level 26a.

U.S. Pat. No. 5,208,782 to Sakuta et al. discusses current consumption during a CBR refresh. However, the peak current during a CBR refresh becomes even more critical as DRAM sizes increase. This is due to larger bit mats, more sub arrays, and four or more simultaneous word line selections during a CBR refresh operation, resulting in the I(BL) reaching a level that is many times larger than the first level 26a. Therefore, what is needed is a system and method in which the total peak current I(BL) for all the bit mats is kept at a reasonably low level.

SUMMARY OF THE INVENTION

The present invention, accordingly, is a method and apparatus for reducing the total peak current for all bit mats during a CBR refresh operation, while maintaining a high sensing speed during a normal operation. To this end, a circuit for detecting a CBR refresh operation is included in an otherwise conventional DRAM circuit. When a CBR refresh operation is detected, the sensing of the bit mats are offset from each other through delay circuits, thereby staggering the time when the current used by each bit mat reaches a peak. During other operations such as a read operation, the delay circuits are circumvented, thereby preventing any delay that would slow the operation down.

In one embodiment, when multiple word lines and multiple bit mats are simultaneously selected, as in a CBR refresh, a first sense amplifier is activated and activation of the remaining sense amplifiers is delayed from the prior sense amplifier activation, thereby staggering the peak current drawn by each bit mat and minimizing the total current consumption at any given time. In a second embodiment, instead of simultaneously selecting multiple word lines and multiple bit mats, a first word line and bit mat are selected and selection of each subsequent word line and bit mat is delayed from the prior word line selection, thereby staggering the peak current drawn by each bit mat and minimizing the peak current at any given time.

An advantage achieved with the present invention is that the peak current of the bit mats and the sense amplifiers at any given time during a refresh operation is kept at a certain low level.

Another advantage achieved with the present invention is that the memory access time during a read operation is kept relatively fast.

DETAILED DESCRIPTION OF THE PREFERRED EMBODIMENT

Figure 1:
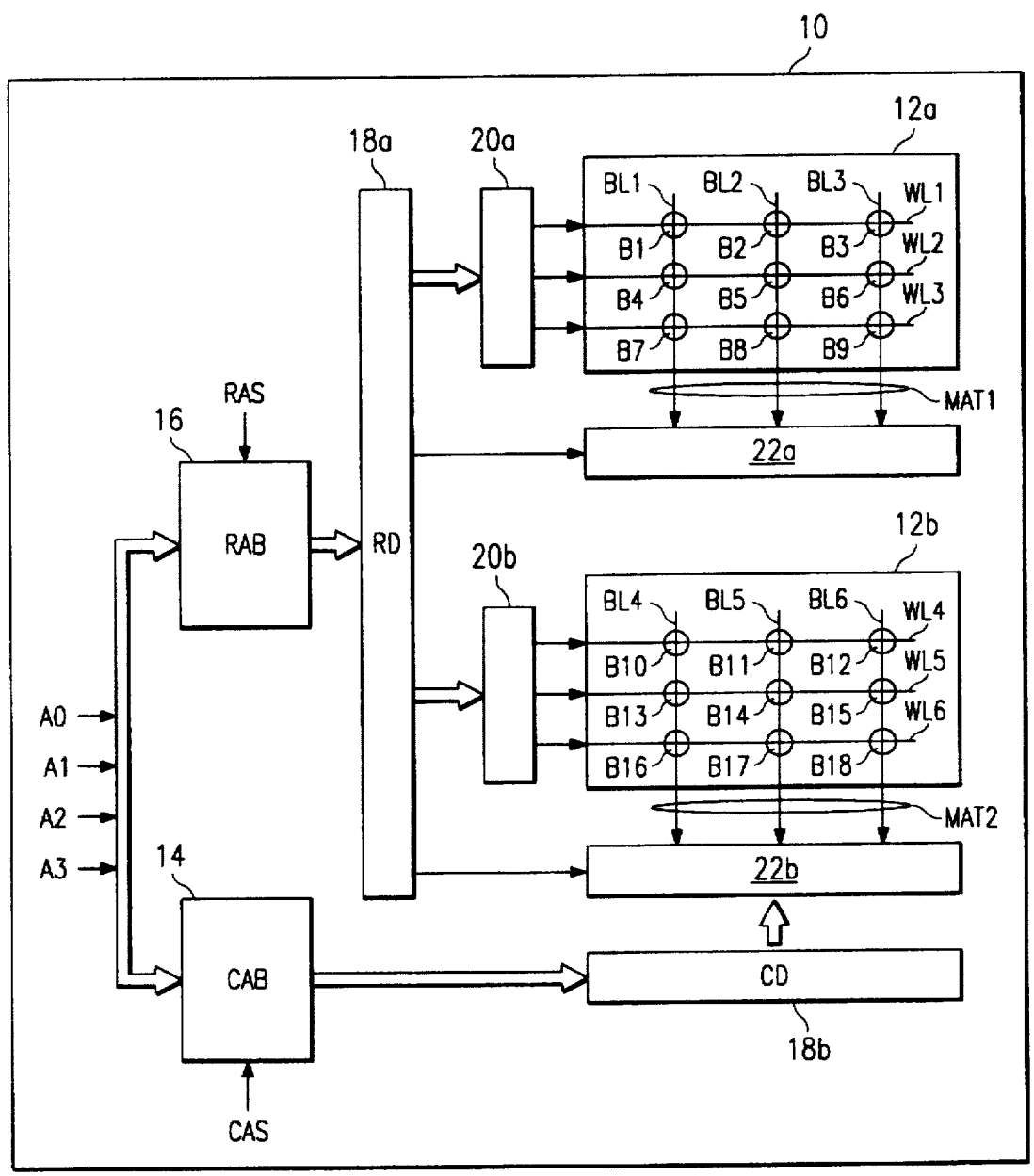
FIG. 1 is a simplified block diagram of a conventional DRAM.
Figure 2:
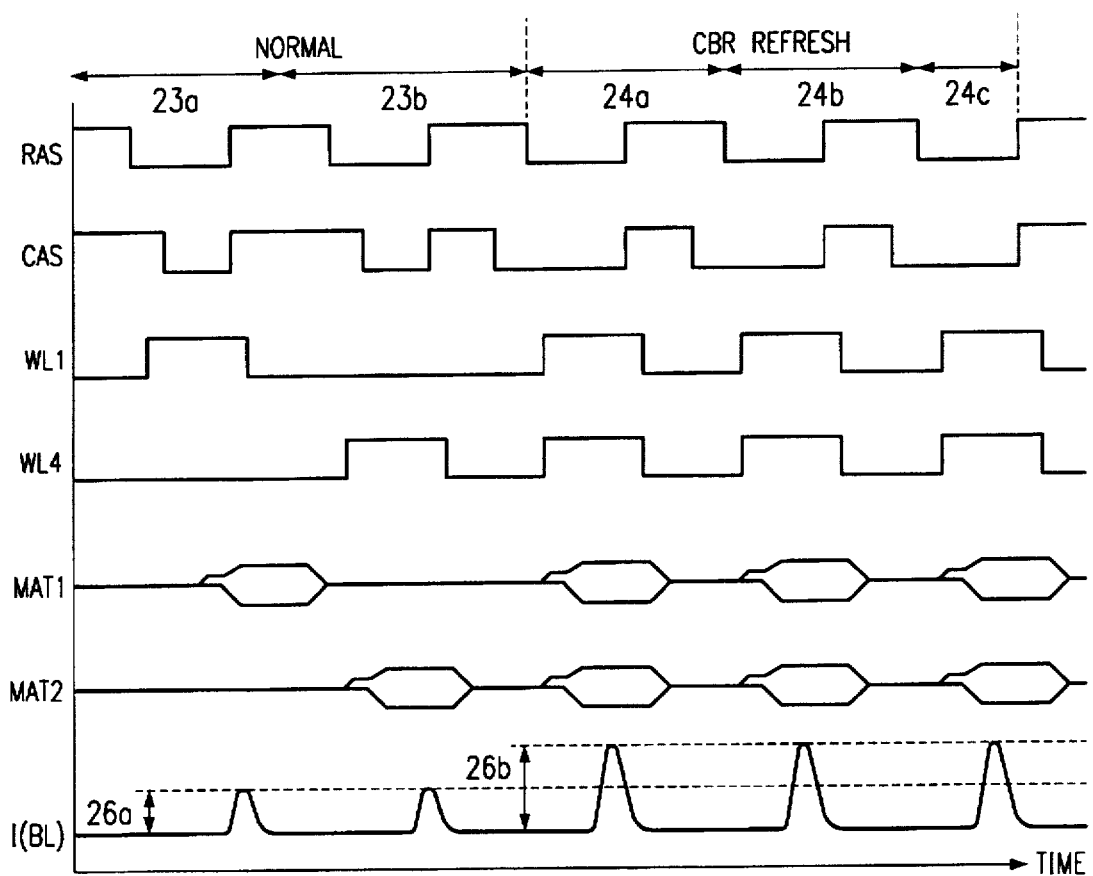
FIG. 2 is a timing diagram of read and CBR refresh operations of the DRAM of FIG. 1.

As described above, FIGS. 1 and 2 respectively show a block diagram of a conventional DRAM circuit and a timing diagram of read and CBR refresh operations of such a DRAM circuit.

Figure 3:
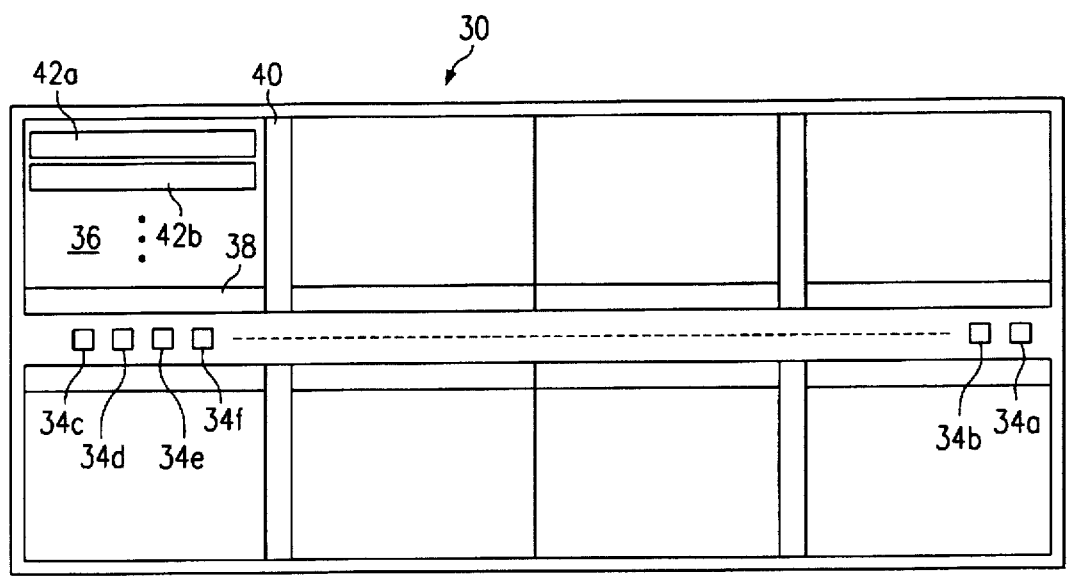
FIG. 3 is a block diagram of a 256 Mbit DRAM embodying features of the present invention.

In FIG. 3, the reference numeral 30 refers to a memory device embodying features of the present invention. While in a preferred embodiment of the invention, the device 30 is a 256 Mbit dynamic random access memory ("DRAM"), it should be understood that the present invention is not limited to use with a DRAM, but may be used in conjunction any integrated circuit device comprising arrays, including programmable array logic and other types of random access memories.

The device 30 includes a number of control signal pads, including a row address strobe ("RAS") pad 34a, a column address strobe ("CAS") pad 34b and a group of address pads 34c–34f, each of which is connected to an external controller (not shown). The device 30 also includes a set of array blocks of memory cells, such as an array block 36, and a group of main address decoders, such as column decoder 38 and row decoder 40. The pads 34c–34f produce address signals A0–A3 (not shown) which are decoded by the main address decoders 38, 40, to select individual array blocks. Array block 36, which is representative of the remaining array blocks of the device 30, is further divided into many memory cell subarrays, two of which are shown in FIG. 4 and respectively designated by reference numerals 42a and 42b.

Because the configuration and operation of the memory cell subarrays 42a, 42b, are representative of the subarrays comprising the device 30, for the remainder of the detailed description, the subarrays 42a, 42b, will be described, along with only a few bits and circuits associated with the subarrays 42a, 42b, it being understood that the description of the subarrays 42a, 42b, and surrounding circuits, is applicable to all such elements comprising the device 30.

Figure 4:
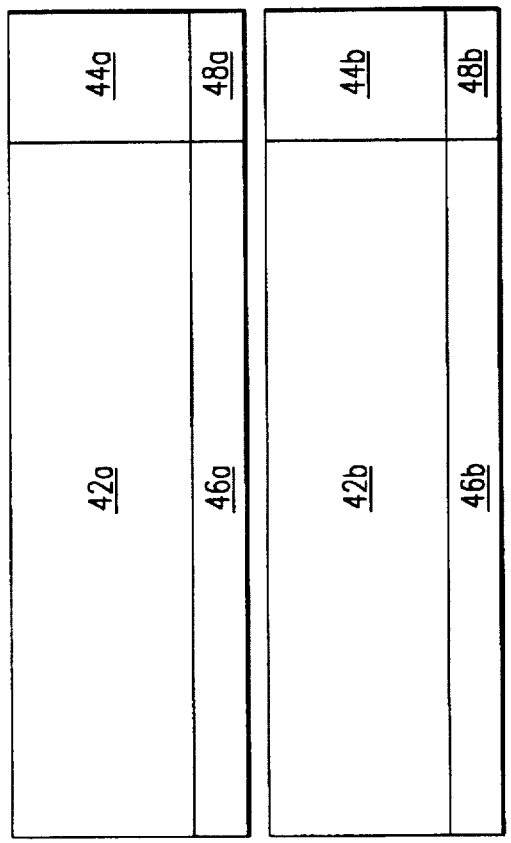
FIG. 4 is a block diagram of a portion of the 256 Mbit DRAM of FIG. 3.

Referring to FIG. 4, bits of the memory cell subarray 42a are selected by signals from a word line driver area 44a. Likewise, bits of the memory cell subarray 42b are selected by signals from a word line driver area 44b. The bits of memory cell subarray 42a are read by a sense amplifier area 46a. Likewise, the bits of memory cell sub array 42b are read by a sense amplifier area 46b. The sense amplifier areas 46a and 46b intersect with the word line driver areas 44a and 44b, at intersection areas 48a and 48b, respectively.

Figure 5:
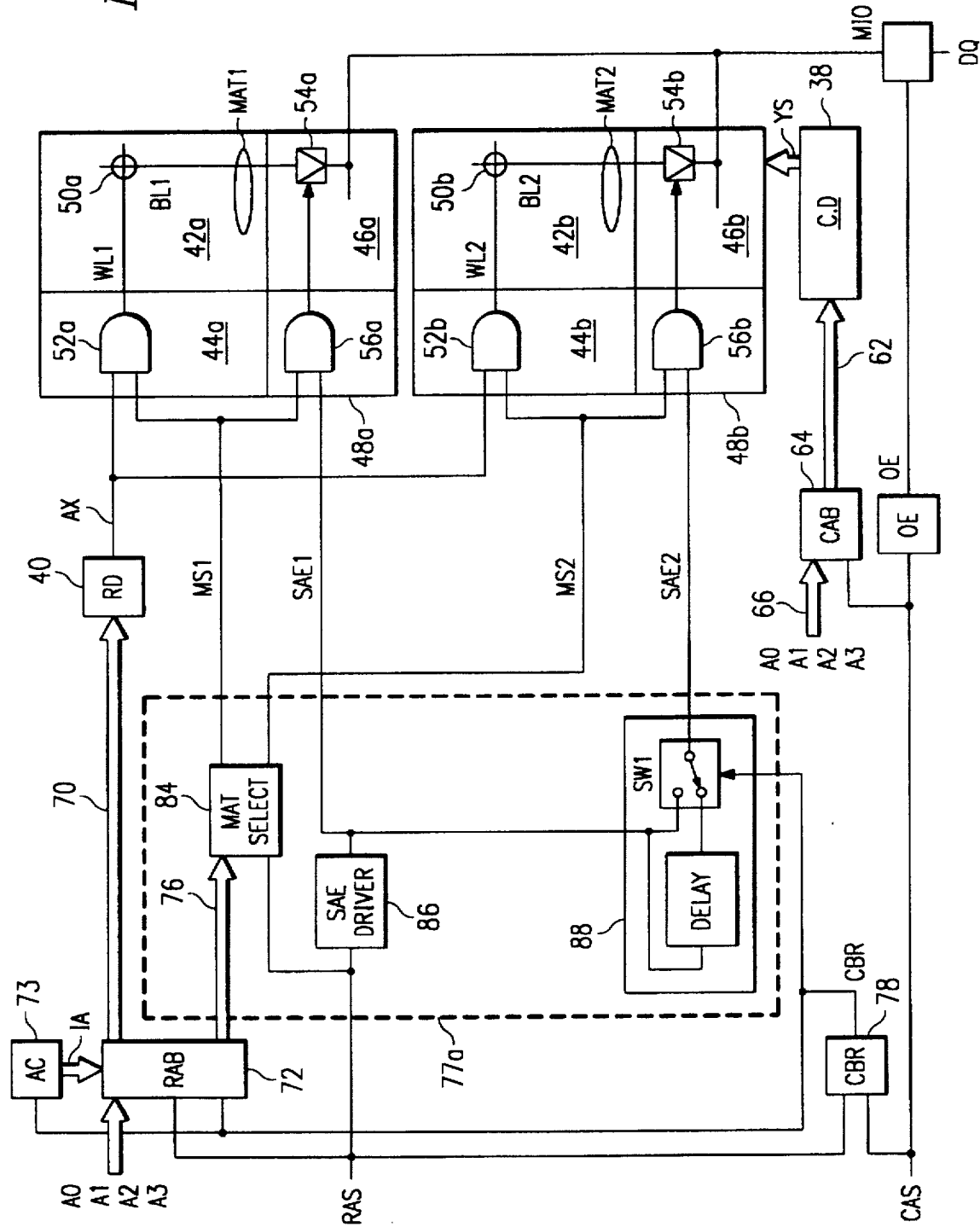
FIG. 5 is a simplified block diagram of a first embodiment of a DRAM circuit embodying features of the present invention.

Referring to FIG. 5, the memory cell sub array 42a includes a first bit 50a for storing a signal, which is connected to a first word line row (WL1) and a first bit line (BL1). A word line driver 52a, located in the word line driver area 44a, drives the word line WL1 to select the first bit 50a. Located in the intersection area 48a is a sense amplifier driver 56a for enabling the sense amplifier circuit 54a located in the sense amplifier area 46a. When the first bit 50a is selected and when the sense amplifier circuit 54a is enabled, the sense amplifier circuit amplifies and reads the signal stored in the first bit 50a through the first bit line BL1.

Although not shown, in the preferred embodiment the word line WL1 is connected to a plurality of bits, each of which drives a bit line. The bit lines are grouped to form a first bit mat MAT1 and are simultaneously sensed by sense amplifier circuits in the sense amplifier area 48a. Therefore, since the simplified block diagram of FIG. 5 only shows one bit 50a, the first bit line BL1 attached to the bit 50a is representative of the entire first bit mat MAT1.

The memory cell sub array 42b is similar to the memory cell sub array 42a. Specifically, the memory cell sub array 42b includes a second bit 50b for storing a signal, which is connected to a second word line row (WL2) and a second bit line (BL2). Likewise, the word line driver area 44b comprises a word line driver 52b connected to the second word line row WL2; the sense amplifier area 46b comprises a sense amplifier circuit 54b connected to the second bit line BL2; and a second sense amplifier driver 56b, located in the intersection area 48b for enabling the sense amplifier circuit 54b. Furthermore, the second bit line BL2 is representative of a second bit mat MAT2.

The word lines WL1 and WL2 and bit mats MAT1 and MAT2 operate in a conventional manner. Therefore, because the memory cell subarrays 42a, 42b, are both from one array block 36 (FIG. 3), only one bit mat is selected at any one time during normal operations. For example, if WL1 and MAT1 are selected, WL2 and MAT2 will not be selected. Likewise, if WL2 and MAT2 are selected, WL1 and MAT1 will not be selected. However, in a 256 Mbit DRAM, due to a plurality of array blocks (FIG. 3), multiple word line selection may occur during normal operations.

The two sense amplifier circuits 46a, 46b, are individually selectable by a column select signal ("YS"). The YS signal is driven by the column decoder 38, which decodes column address signals from a column address bus 62. The column address bus 62 is driven by a column address buffer 64. The column address buffer 64 functions as an input buffer for an external column address 66 and is enabled by a CAS signal in a conventional manner and therefore will not be further discussed.

The first sense amplifier driver 56a has inputs including a first mat select signal ("MS1") and a first sense amplifier enable signal ("SAE1"). Likewise, the second amplifier driver 56b has inputs including a second mat select signal ("MS2") and a second sense amplifier enable signal ("SAE2"). With these inputs, each sense amplifier driver 56a, 56b, may be selected individually, or in combination with any other sense amplifier driver.

The first word line driver 52a has inputs including a row decode signal ("AX") and the MS1 signal. Likewise, the second word line driver 52b has inputs of AX and MS2. With these inputs, each word line driver 52a, 52b, may be selected individually, or in combination with any other word line driver.

The AX signal is driven by the row decoder 40, which decodes row address signals from a row address bus 70. The row decoder 40 is enabled by the row address bus 70 in a conventional manner and will not be further discussed. The row address bus 70 is driven by a row address buffer 72. The row address buffer 72 stores the four address signals A0–A3 from address pads 34c–34f (FIG. 3) during normal operation. However, during a CAS-before-RAS (CBR) refresh operation, an address counter 73 produces internal address signals IA0–IA2, shown collectively as IA, and outputs them to the row address buffer 72. The address counter 73 generates the internal address signals IA in a conventional manner and will not be further discussed. The row address buffer 72 comprises four row address circuits for driving a plurality of row address signals, as discussed in detail below with reference to FIGS. 6–9.

Figure 6:
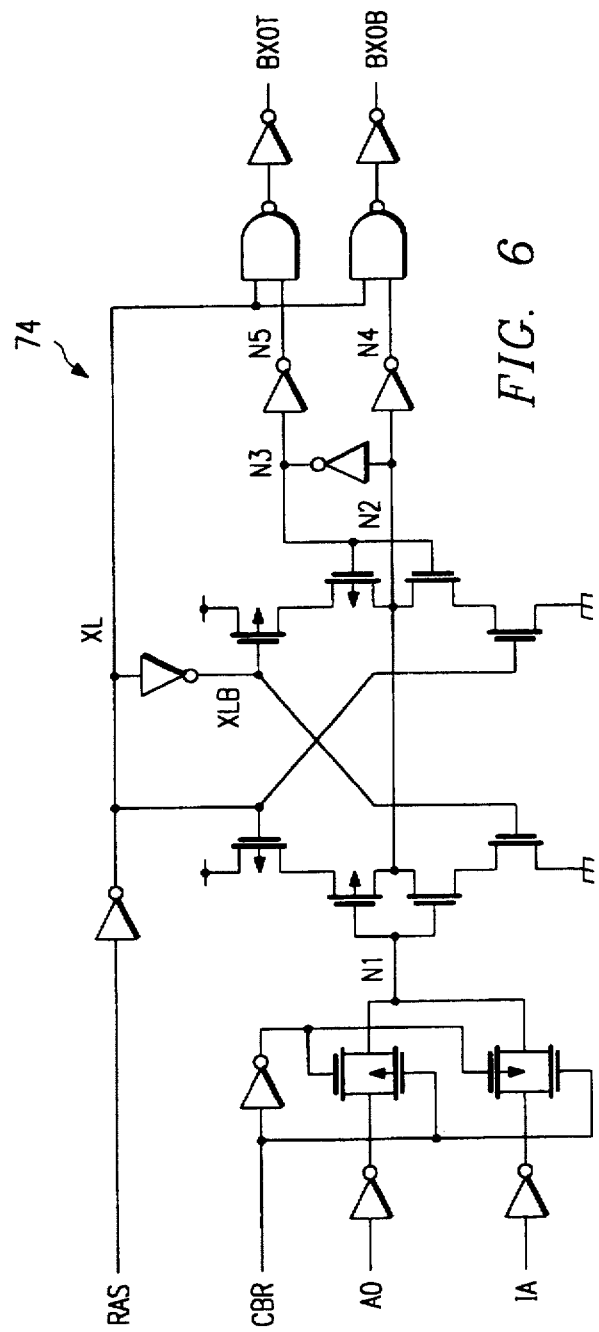
FIG. 6 is a schematic diagram of a first address buffer circuit of FIG. 5.

Referring to FIG. 6, a first address buffer circuit 74 is illustrated, as representative of the four address buffer circuits of the address buffer 72 (FIG. 5). The first address buffer circuit 74 has inputs of A0, IA0, RAS and a CBR signal. The CBR signal is active when a CBR refresh operation is in progress, as discussed in greater detail below with reference to FIGS. 10 and 11.

Figure 7:
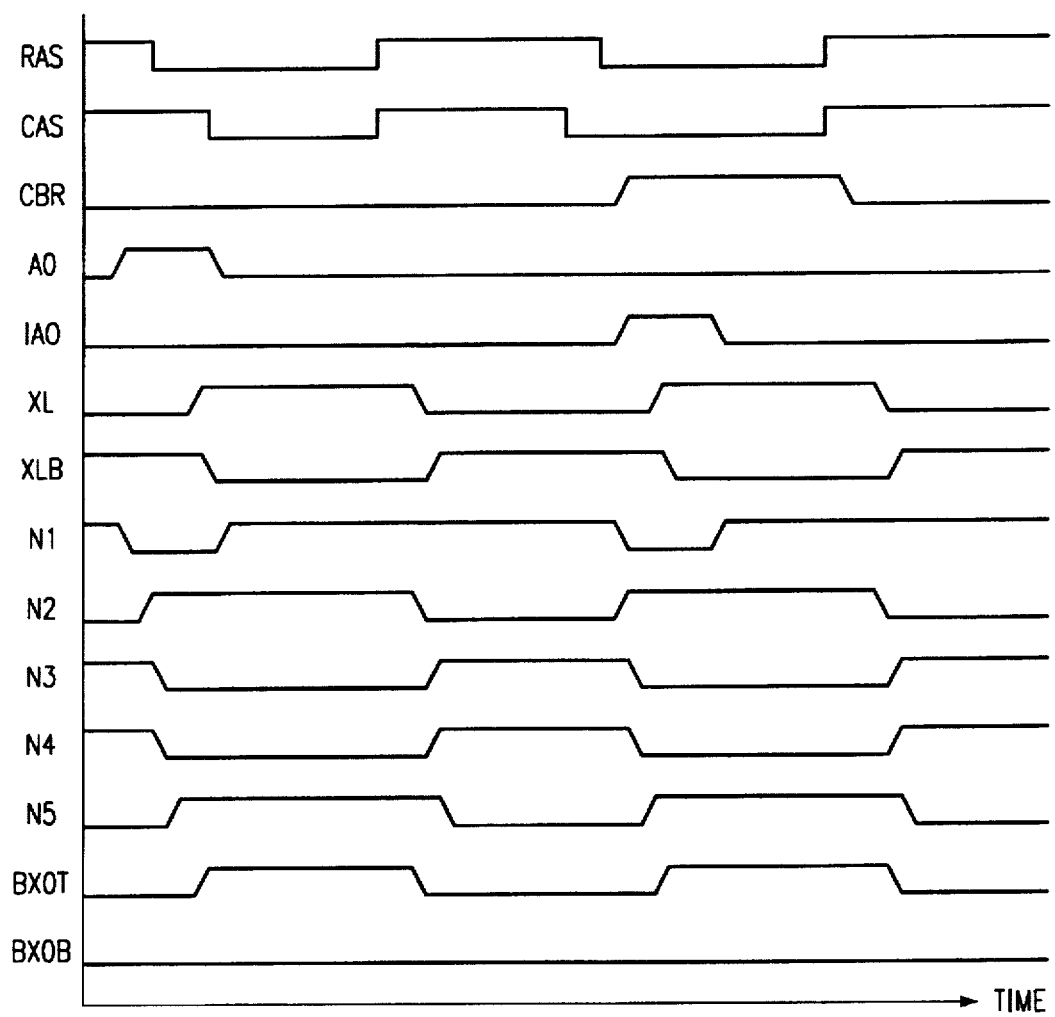
FIG. 7 is a timing diagram of the first address buffer of FIG. 6.

Referring to FIGS. 6 and 7, during normal operations, the IA0 signal is ignored and the A0 signal is stored. However, during a CBR refresh operation, the A0 signal is ignored and the IA0 signal is stored. The first address buffer circuit 74 thereby generates two row address signals BX0T and BX0B, as shown both schematically in FIG. 6 and in the timing diagram of FIG. 7. During both normal and CBR refresh operations, only one of the two row address signals BX0T and BX0B is asserted at any one time. Likewise, second and third address buffer circuits (not shown) include inputs of A1 / IA1 and A2 / IA2, respectively, and generate outputs of BX1T / BX1B and BX2T / BX2B, respectively.

Figure 8:
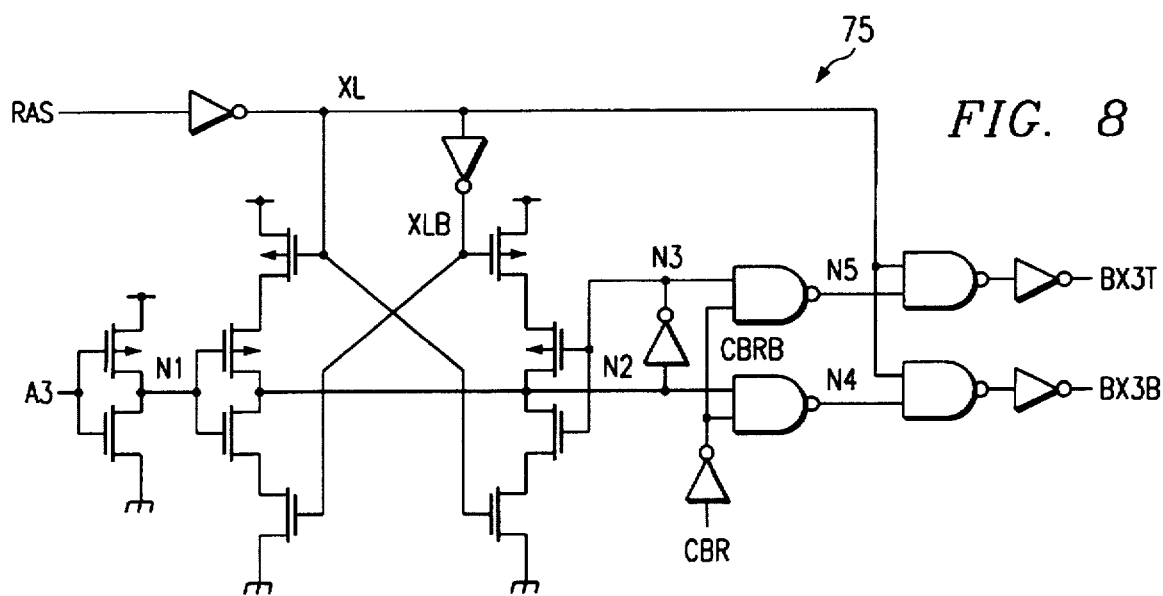
FIG. 8 is a schematic diagram of a fourth address buffer circuit of FIG. 5.
Figure 9:
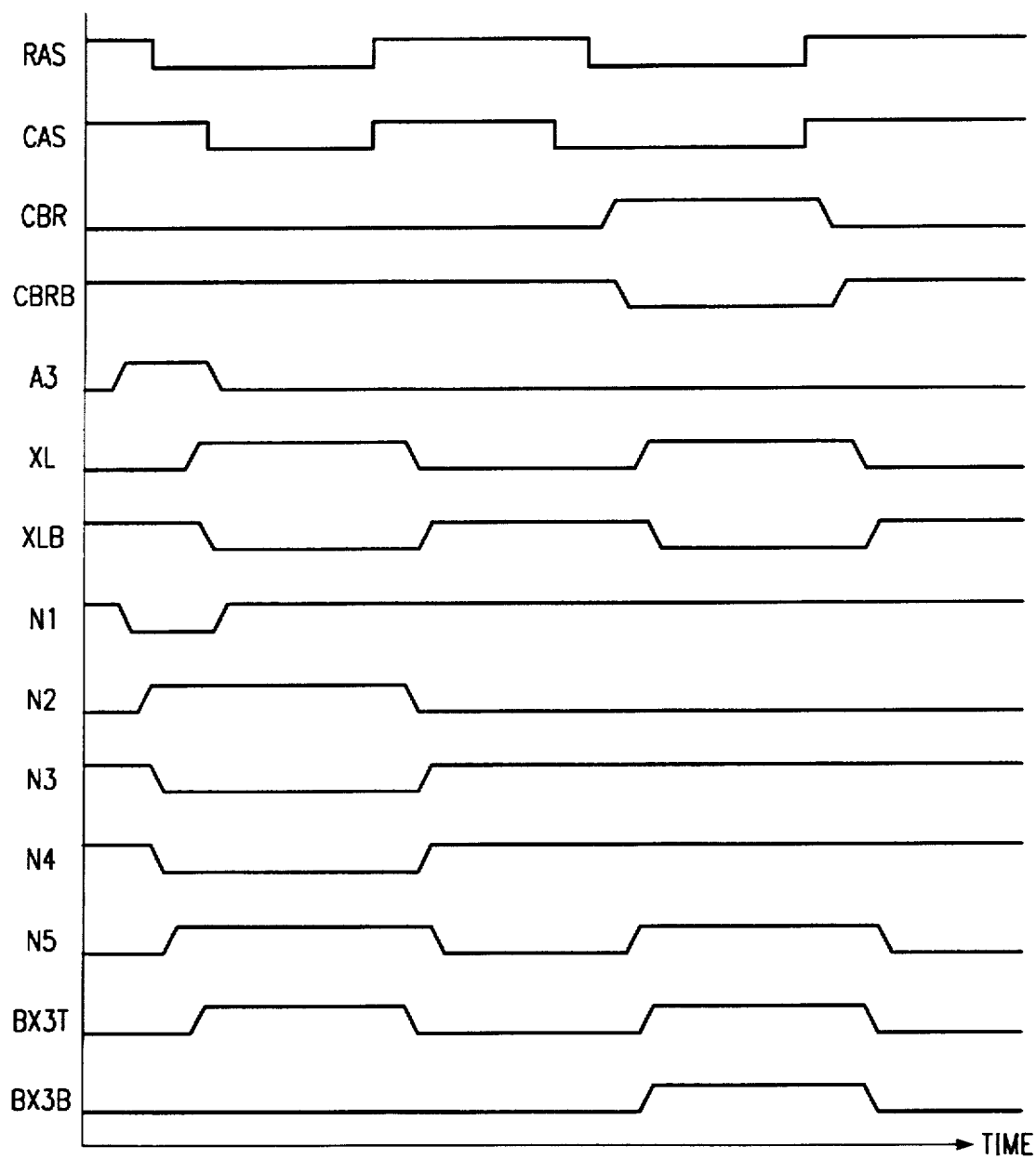
FIG. 9 is a timing diagram of the fourth address buffer of FIG. 8.

Referring to FIGS. 8 and 9, a fourth address buffer circuit 75 having inputs of RAS, CBR and A3, generates two row address signals BX3T and BX3B, as shown both schematically in FIG. 8 and in the timing diagram of FIG. 9. During normal operations, the fourth address buffer circuit 75 behaves similarly to the first address buffer circuit 74. However, during a CBR refresh operation, the A3 signal is ignored and both BX3T and BX3B are asserted. In this way, two word lines are activated at one time during a CBR refresh operation.

The row address signals BX0T, BX1T, BX2T, BX0B, BX1B and BX2B comprise the row address bus 70 (FIG. 5), and the row address signals BX3T and BX3B comprise a mat select bus 76 (FIG. 5).

Figure 10:
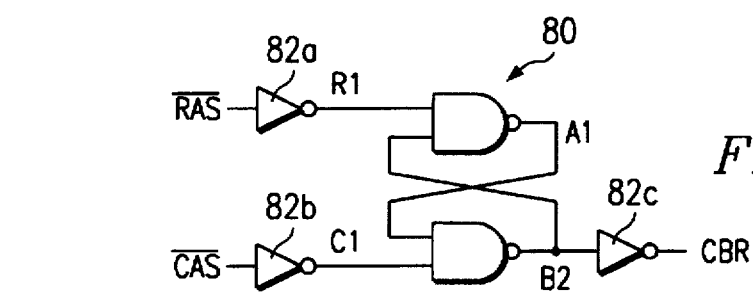
FIG. 10 is a schematic diagram of the CBR control circuit of FIG. 5.
Figure 11:
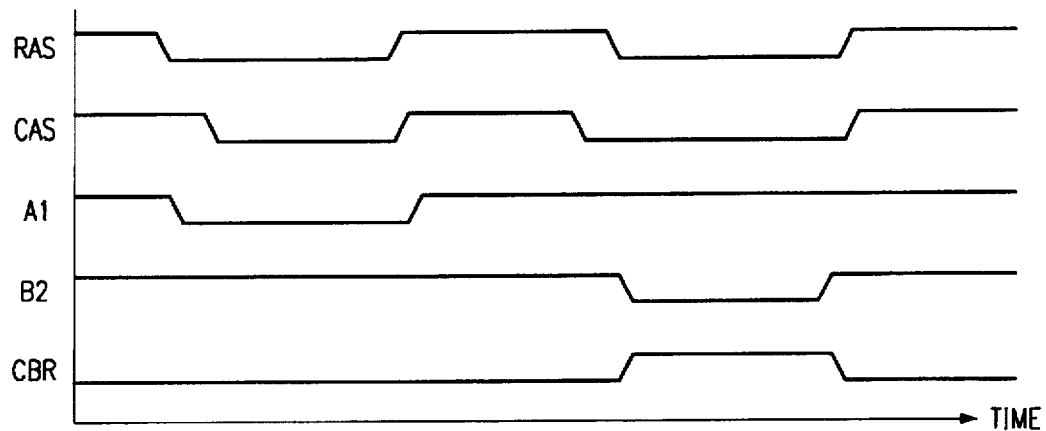
FIG. 11 is a timing diagram of the CBR control circuit of FIG. 10.

Referring to FIGS. 10 and 11, a CBR control circuit 78 generates the CBR signal. The CBR control circuit has inputs of the CAS and RAS signals and comprises a flip flop 80. The CBR control circuit asserts the CBR signal whenever the CAS signal is asserted before the RAS signal, as shown both schematically in FIG. 10 and in the timing diagram of FIG. 11.

Referring again to FIG. 5, the mat select bus 76, the RAS signal, and the CBR signal are inputs to a group logic circuit designated generally by reference numeral 77a. The signals MS1, MS2, SAE1 and SAE2 are outputs of the group logic circuit 77a. The group logic circuit 77a comprises a mat selector circuit 84 and a timing signal generator comprising a sense amplifier enable (SAE) driver 86 and an SAE delay circuit 88. The mat selector 84 has inputs from the mat select bus 76 (FIG. 5) and the RAS signal. In a conventional manner, the mat selector 84 produces a plurality of mat select signals, such as the two mat signals MS1 and MS2. The RAS signal is input to the SAE driver 86, which produces the SAE1 signal in a conventional manner. The SAE1 signal is input to the SAE delay circuit 88, which produces the SAE2 signal, as described in greater detail below.

Figure 12:
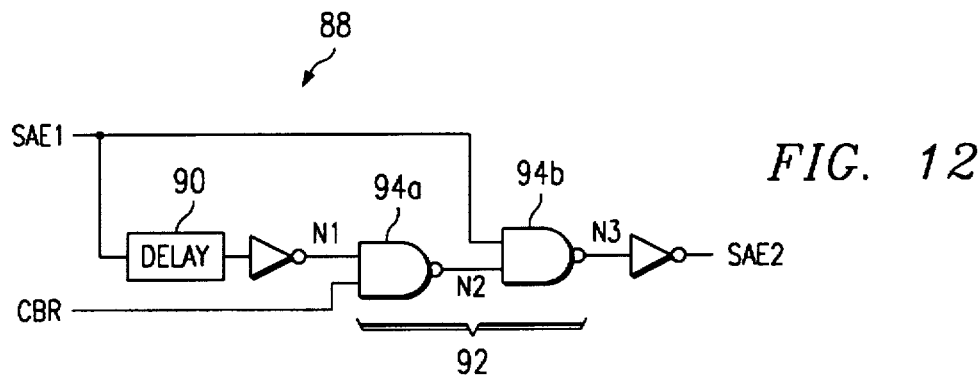
FIG. 12 is a schematic diagram of the SAE delay switch of FIG. 5.
Figure 13:
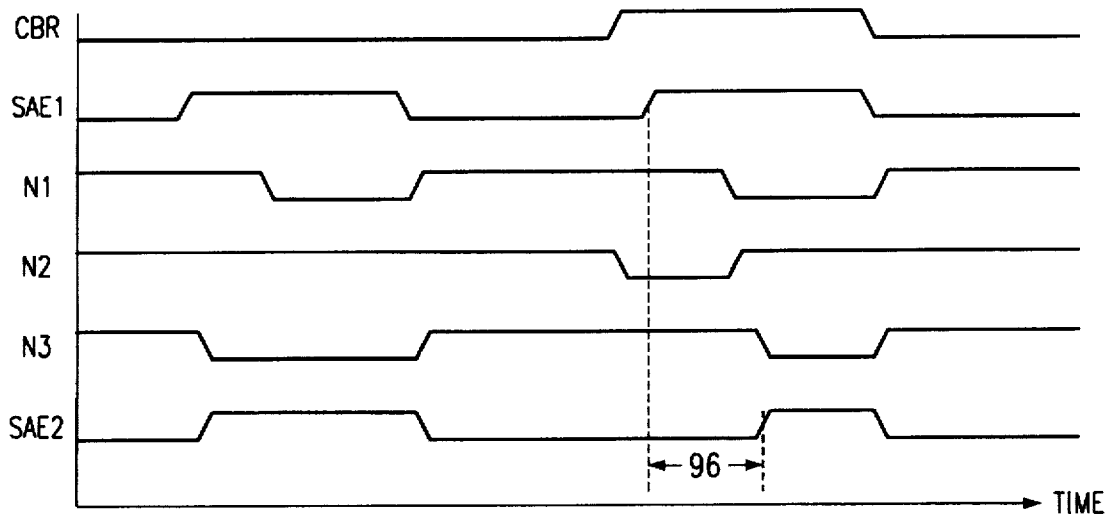
FIG. 13 is a timing diagram of the SAE delay switch of FIG. 12.

Referring to FIGS. 12 and 13, the SAE delay circuit 88 comprises a delay circuit portion 90 and a switch circuit portion 92, wherein the switch circuit portion is controlled by the CBR signal and comprises a series of NAND gates 94a and 94b. When the CBR signal is not asserted, the SAE1 signal drives the SAE2 signal with only a negligible delay. However, when the CBR signal is asserted, the SAE1 signal drives the SAE2 signal after a substantial delay time 96. The amount of the delay time 96 is determined by the delay circuit portion 90. There are many conventional ways to create the delay circuit 90, and hence the delay time 96. Examples include a string of invertor drivers or R-C delay circuits.

Referring also to FIG. 5, during a CBR refresh operation where two word lines, such as WL1 and WL2, are simultaneously selected, enablement of the second sense amplifier circuits corresponding to WL2 will be delayed, thereby separating in time the occurrence of the peak current drawn by the MAT2 from the occurrence of the peak current drawn by the MAT1.

Figure 14:
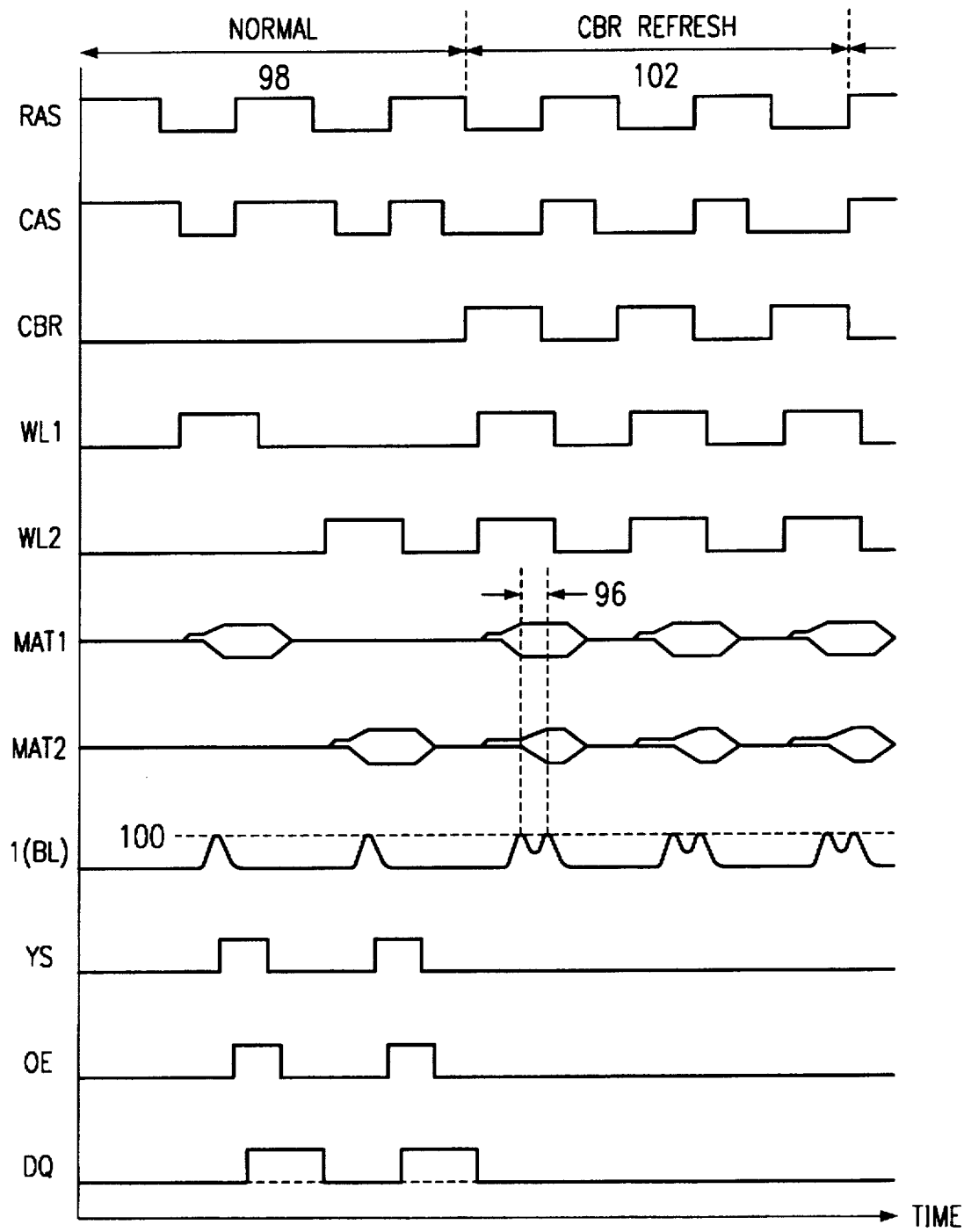
FIG. 14 is a timing diagram of read and CBR refresh operations of the DRAM of FIG. 5.

Referring to FIG. 14, the present invention thereby maintains a consistent peak current for all memory operations. A first timing set 98 is indicative of a pair of normal operations, such as a read or write operation. In these operations, the RAS signal is always asserted before the CAS signal. As a result, the CBR signal is not asserted. Also in the first timing set 98, only one word line is asserted at a time. For example, in the first operation, only the word line WL1 is asserted, and in the second operation, only the word line WL2 is asserted. Therefore only the bit mat MAT1 is activated in the first operation and only the bit mat MAT2 is activated in the second operation. As a result, the peak current for all the bit mats, represented by the waveform labeled I(BL), reaches a first level 100.

A second timing set 102 is indicative of multiple CBR refresh operations. In these operations, the CAS signal is always asserted before the RAS signal. As a result, the CBR signal is asserted. Also in the second timing set 102, two word lines are asserted at the same time. For example, both word lines WL1 and WL2 are asserted simultaneously; therefore, both bit mats MAT1 and MAT2 are activated simultaneously. However, both bit mats MAT1 and MAT2 are not amplified simultaneously. Since the bit mat MAT1 is amplified in response to SAE1 (FIG. 5) and the bit mat MAT2 is amplified in response to SAE2 (FIG. 5), the peak current due to the bit mat MAT2 selection is delayed in the amount of the delay time 96 from the peak current due to the bit mat MAT1 selection. As a result, I(BL) still only reaches the first level 100.

Figure 15:
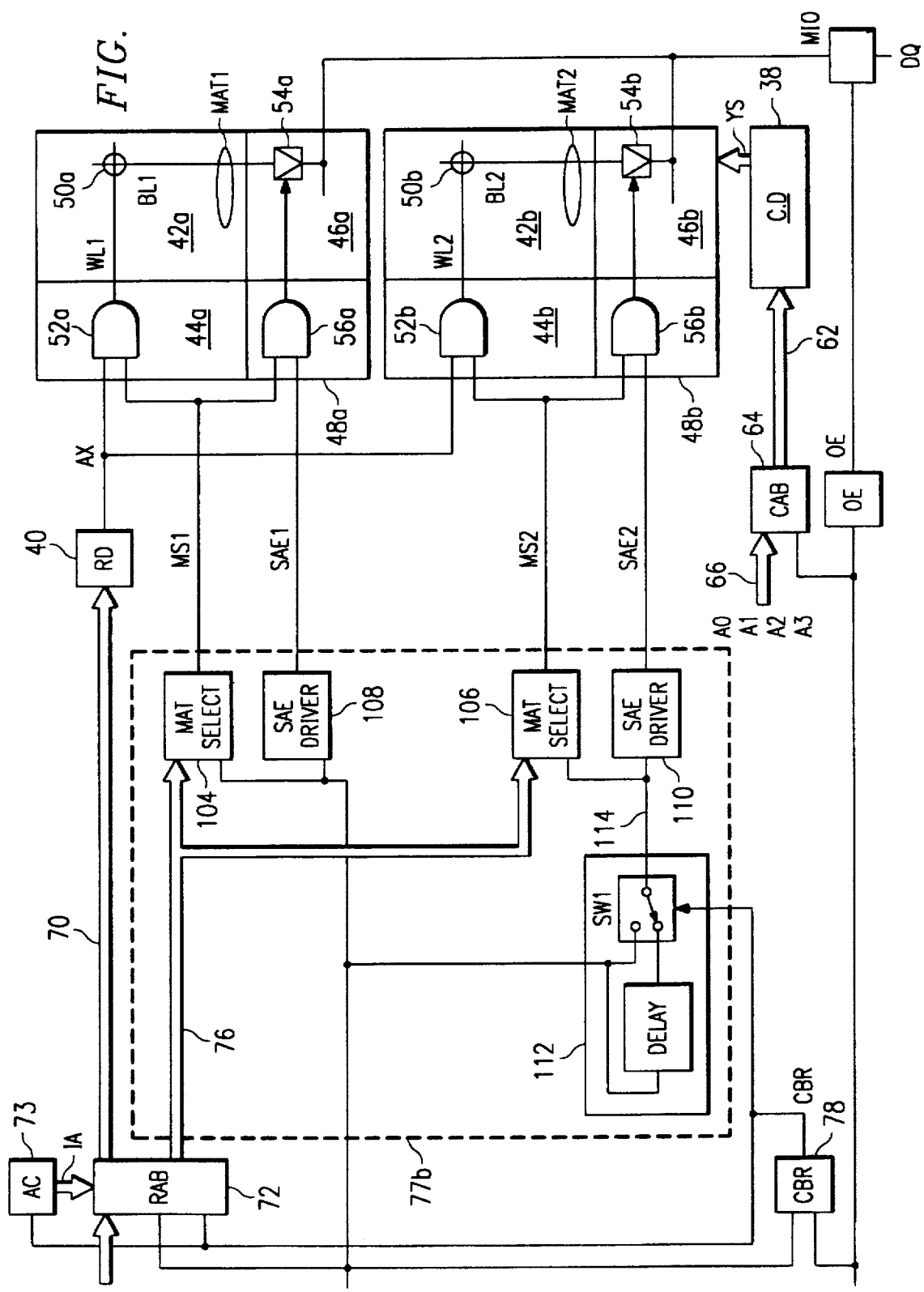
FIG. 15 is a simplified block diagram of a second embodiment of a DRAM circuit embodying features of the present invention.

Referring to FIG. 15, in a second embodiment, the majority of components are the same as in FIG. 5, except that a group logic circuit 77b is substituted for the group logic circuit 77a. The group logic circuit 77b comprises first and second mat selectors 104, 106, first and second sense amplifier enable (SAE) drivers 108, 110, and an RAS delay circuit 112. The first mat selector 104 has inputs from the mat select bus 76 and the RAS signal. The second mat selector 106 has inputs from the mat select bus 76 and a second RAS signal 114. During normal operation, the second RAS signal 114 immediately follows the RAS signal. During a CBR refresh operation, the second RAS signal 114 is delayed from the RAS signal. The delay for the second RAS signal 114 is produced by the RAS delay circuit 112, which is identical to the SAE delay circuit 88, discussed in FIG. 5, except it has an input of the RAS signal instead of the SAE1 signal. In this manner, instead of delaying activation of the sense amplifier drivers 56a–56b, as in the first embodiment, activation of the word line WL2 is delayed, as shown below.

Figure 16:
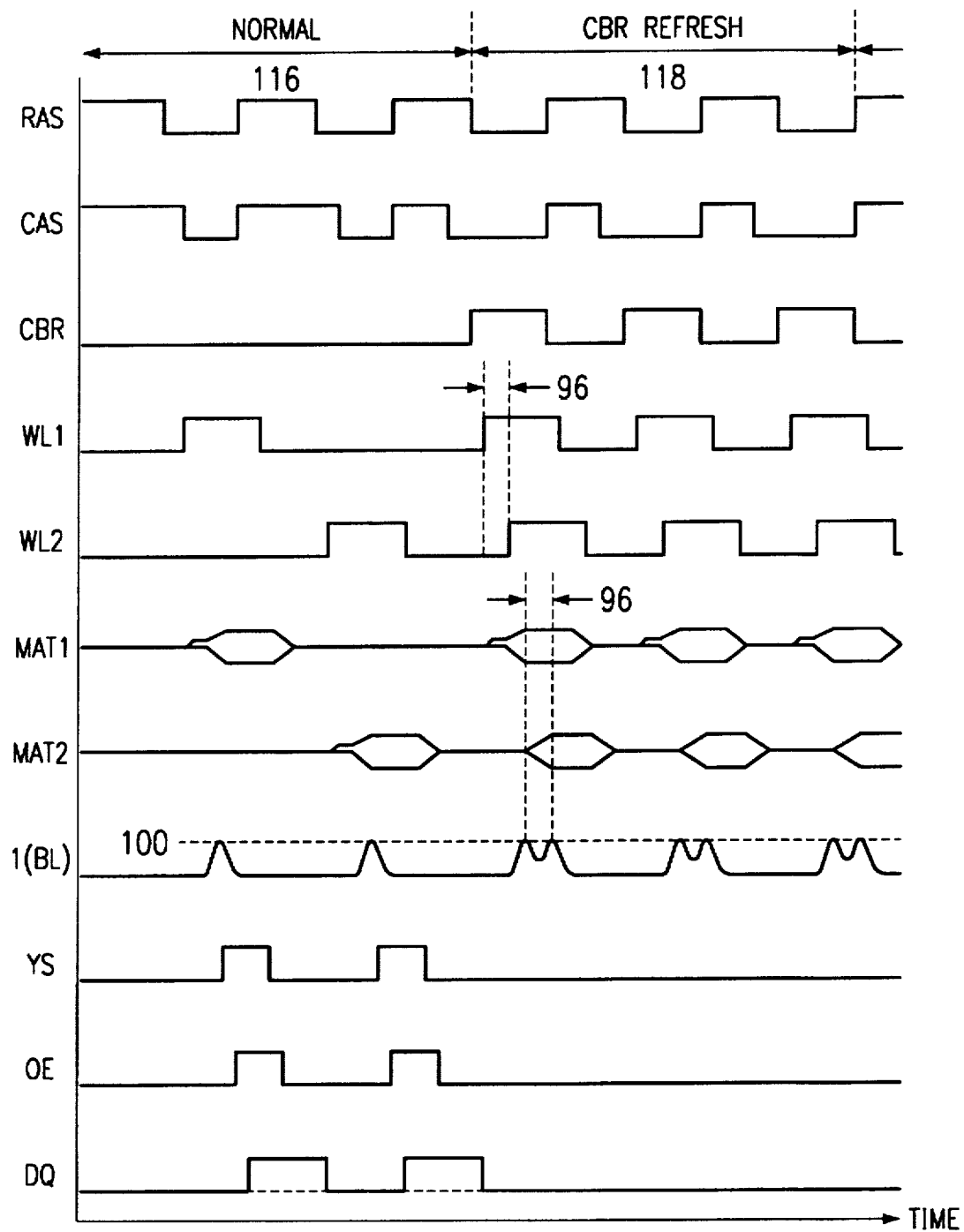
FIG. 16 is a timing diagram of read and CBR refresh operations of the DRAM of FIG. 15.

Referring to FIG. 16, in the second embodiment, the present invention thereby maintains a consistent peak current for all memory operations. A first timing set 116 is indicative of a pair of read or write cycles. This timing set is identical to the timing set 98 of FIG. 14.

A second timing set 118 is indicative of multiple CBR refresh operations. This timing set 118 differs from the timing set 102 of FIG. 14. In the timing set 118, the CAS signal is always asserted before the RAS signal. As a result, the CBR signal is asserted. During CBR refresh operations, two word lines are selected, such as WL1 and WL2. However, the selection of WL2 is delayed from the selection of WL1 by the delay time 96. As a result, the corresponding bit mat activation is delayed by the delay time 96. For example, both word lines WL1 and WL2 are asserted during the CBR refresh operations. The word line WL2 is asserted after the word line WL1 in an amount equal to the delay time 96 for each operation, hence the bit mat MAT2 is activated and amplified after the bit mat MAT1. As a result, I(BL) still peaks at the first level 100.

Figure 17:
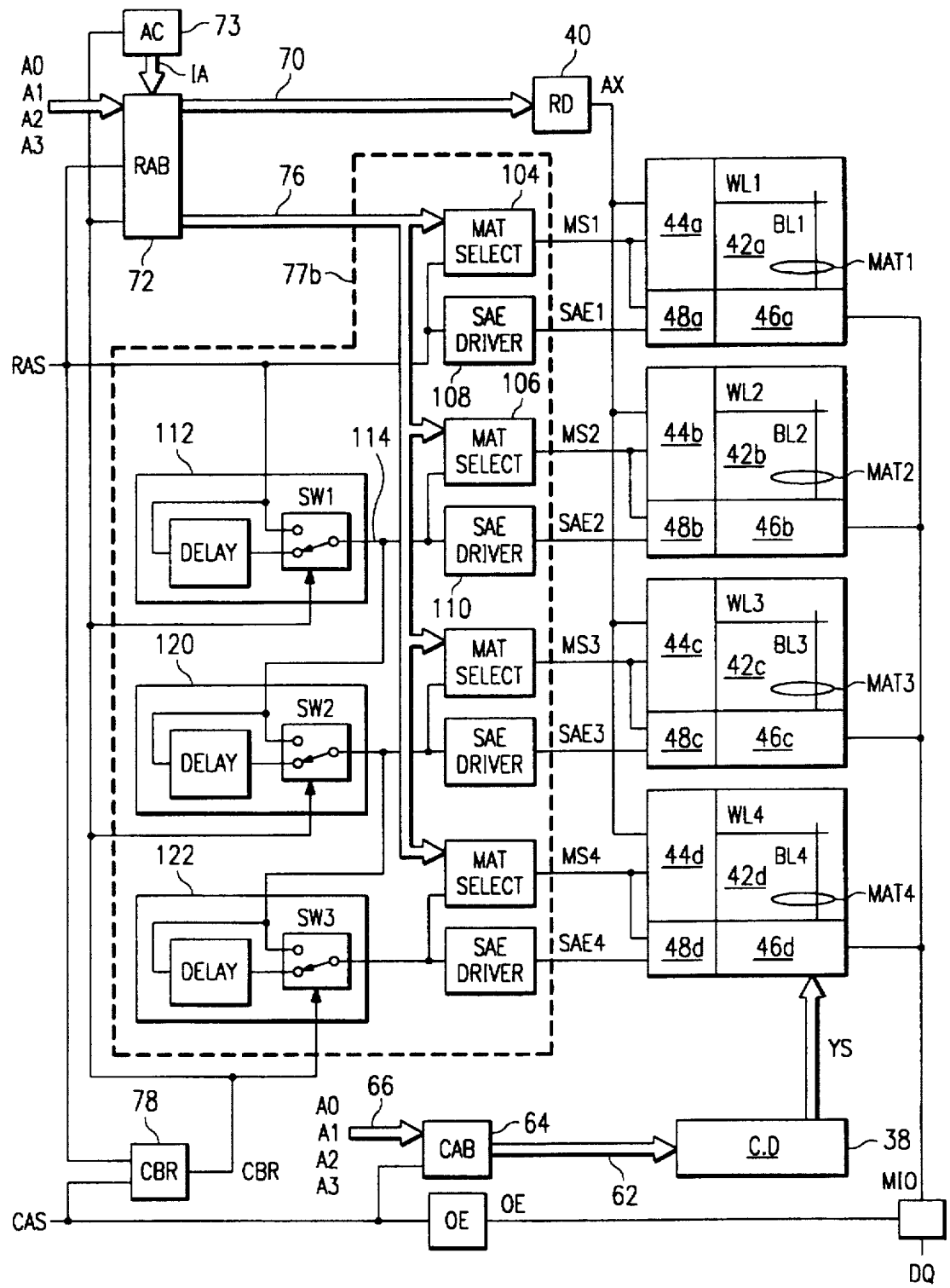
FIG. 17 is a simplified block diagram of a third embodiment of a DRAM circuit embodying features of the present invention.
Figure 18:
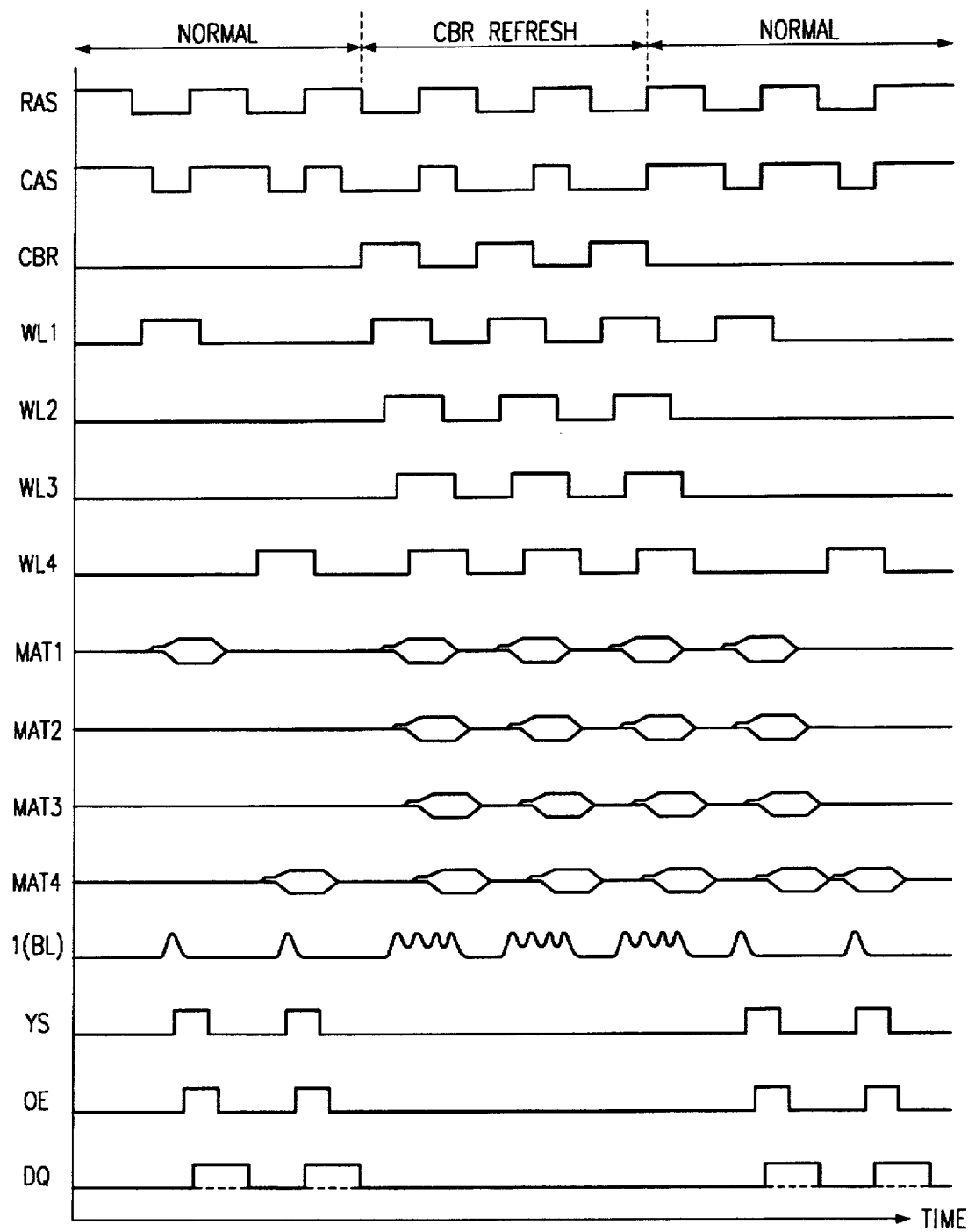
FIG. 18 is a timing diagram of read and CBR refresh operations of the DRAM of FIG. 17.

The first and second embodiments, described above, have been simplified in their application to the two memory cell subarrays 42a–42b. However, simple, obvious expansion of the two embodiments will make the present invention applicable to very large DRAMS. For example, referring to FIGS. 17 and 18, an expanded version of the second embodiment of the present invention is shown, which comprises the second embodiment, as shown in FIG. 17, and a second and third RAS delay circuits 120 and 122. Each subsequent RAS delay circuit is cascaded from the previous circuit. The input of the second RAS delay circuit 120 is connected to the output of the first RAS delay circuit 112, while the input of the third RAS delay circuit 122 is connected to the output of the second RAS delay circuit 120. As a result, when a plurality of word lines are selected during a CBR refresh operation, activation of each word line is delayed in time from the activation of the preceding word line, so that only one word line is activated at any one time.

In a similar manner, an expanded version of the first embodiment may be created by cascading a plurality of SAE delay circuits, such as the SAE delay circuit 88 shown in FIG. 5. Similar to the embodiment shown in FIG. 17, this may be achieved by tying the input of a second SAE delay circuit to the output of the first SAE delay circuit 88, and so forth. As a result, during a CBR refresh operation, activation of each sense amplifier will be delayed in time from activation of the preceding sense amplifier, so that only one mat will be activated at any given time, thereby minimizing the peak level of I(BL).

Although illustrative embodiments of the present invention have been shown and described, a latitude of modification, change and substitution is intended in the foregoing disclosure, and in certain instances, some features of the invention will be employed without a corresponding use of other features. Furthermore, additional buffers, drivers, delay circuits and other circuits may be added to the illustrative embodiment without altering the scope of the invention. Accordingly, it is appropriate that the appended claims be construed broadly and in a manner consistent with the scope of the invention.

What is claimed is:

1. A semiconductor memory comprising:
   first and second memory blocks each of which has a plurality of bit lines, a plurality of word lines, a plurality of dynamic memory cells and a plurality of sense amplifiers respectively coupled to said plurality of bit lines;
   a first drive circuit which supplies operating current to said plurality of sense amplifiers in said first memory block;
   a second drive circuit which supplies operating current to said plurality of sense amplifiers in said second memory block;
   a third drive circuit which selects one of said plurality of word lines in said first memory block;
   a fourth drive circuit which selects one of said plurality of word lines in said second memory block;
   a timing signal generator which outputs a first timing signal and a second timing signal that is delayed relative to said first timing signal; and
   a control circuit which selects one of said first and second memory blocks in a normal operation mode and selects both of said first and second memory blocks in a refresh operation mode,
   wherein, in said normal operation mode, a corresponding one of said first and second drive circuits and a corresponding one of said third and fourth drive circuits are activated in response to said first timing signal; and
   wherein, in said refresh operation mode, said first and third drive circuit are activated in response to said first timing signal and said second and fourth drive circuits are activated in response to said second timing signal.

2. A semiconductor memory according to claim 1, wherein said refresh operation mode is a CBR (column address strobe-before-row address strobe signal) refresh operation mode.

3. A semiconductor memory device according to claim 2, wherein said timing signal generator has a delay circuit, said second timing signal is output through said delay circuit, and said first timing signal is output without going through said delay circuit.

4. A semiconductor memory device comprising:
   a first memory cell array and a second memory cell array, each of which has a plurality of bit lines, a plurality of word lines and a plurality of dynamic memory cells;
   a timing signal generator which outputs a first timing signal and a second timing signal that is delayed relative to said first timing signal;

a first driver which selects one of said plurality of word lines in said first memory cell array;

a second driver which selects one of said plurality of word lines in said second memory cell array;

a first sense amplifier group including a plurality of sense amplifiers that correspond to said plurality of bit lines in said first memory cell array;

a second sense amplifier group including a plurality of sense amplifiers that correspond to said plurality of bit lines in said second memory cell array; and a selecting circuit that selects one or both of said first and second memory cell arrays, wherein, when one of said first and second memory cell arrays is selected, a corresponding one of said first and second drivers and said plurality of sense amplifiers in the corresponding one of selected sense amplifier groups operate in response to said first timing signal, and wherein, when both of said first and second memory cell arrays are selected, said first driver and said plurality of sense amplifiers in said first sense amplifier group operate in response to said first timing signal and said second driver and said plurality of sense amplifiers in said second sense amplifier group operate in response to said second timing signal.

5. A semiconductor memory device according to claim 4, wherein said timing generator has a delay circuit, said second timing signal is output through said delay circuit, and said first timing signal is output without going through said delay circuit.

6. A semiconductor memory device according to claim 5, wherein said selecting circuit selects both of said first and second memory arrays in a refresh operating mode, and wherein said selecting circuit selects one of said first and second memory arrays in the normal operating mode.

7. A semiconductor memory device according to claim 6, further comprising a refresh mode detecting circuit, wherein said timing signal generator is controlled on the basis of a signal output from said refresh mode detecting circuit.

8. A semiconductor memory device according to claim 7, wherein said first and second timing signals are generated on the basis of an external timing signal supplied to said semiconductor memory device.

* * * * *